United States Patent [19]
Ito et al.

[11] Patent Number: 6,009,712
[45] Date of Patent: Jan. 4, 2000

[54] TEMPERATURE CONTROLLER OF OPTICAL MODULE PACKAGE

[75] Inventors: Akishige Ito; Seiji Funakawa, both of Tokyo, Japan

[73] Assignee: Ando Electric Co., Ltd., Tokyo, Japan

[21] Appl. No.: 09/121,442

[22] Filed: Jul. 23, 1998

[30] Foreign Application Priority Data

Jul. 29, 1997 [JP] Japan .................................. 9-218153

[51] Int. Cl.$^7$ .................................................. F25D 15/00
[52] U.S. Cl. ............................................. 62/3.7; 62/259.2
[58] Field of Search .................... 62/3.7, 259.2; 385/89

[56] References Cited

U.S. PATENT DOCUMENTS

| | | | |
|---|---|---|---|
| 4,338,577 | 7/1982 | Sato et al. | 372/36 |
| 4,884,279 | 11/1989 | Odagiri | 372/29 |
| 4,947,648 | 8/1990 | Harwell et al. | 62/3.2 |
| 5,267,252 | 11/1993 | Amano | 372/34 |
| 5,392,303 | 2/1995 | Shiozawa et al. | 372/32 |
| 5,446,750 | 8/1995 | Ohtsuka et al. | 372/34 |
| 5,522,225 | 6/1996 | Eskandari | 62/3.7 |

FOREIGN PATENT DOCUMENTS 000478204  4/1992  European Pat. Off. .................. 62/3.7

*Primary Examiner*—Henry Bennett
*Assistant Examiner*—Melvin Jones
*Attorney, Agent, or Firm*—Flynn, Thiel, Boutell & Tanis, P.C.

[57] ABSTRACT

A temperature controller of an optical module package comprises an optical element and first thermistor fixedly held over a first Peltier element housed in an optical module package with a base interposed therebetween; a second thermistor housed in the optical module package; and a second Peltier element with the optical module package fixedly attached thereon with a mount interposed therebetween. While temperature control of the optical module package is achieved by monitoring the temperature of the optical module package with the second thermistor and controlling the second Peltier element, temperature control of the optical element is achieved by monitoring the temperature of the optical element with the first thermistor and controlling the first Peltier element. The temperature controller of the optical module package is impervious to the effect of open air temperature and capable of saving required space.

3 Claims, 2 Drawing Sheets

TEMPERATURE CONTROLLER OF OPTICAL MODULE PACKAGE

BACKGROUND OF THE INVENTION

1. Field of the Invention

The invention relates to a temperature controller of an optical module package, and more particularly, to a temperature controller of an optical module package comprising a first Peltier element for controlling the temperature of an optical element housed in an optical module package, and a second Peltier element for controlling the temperature of the optical module package so as to stabilize the temperature of the optical module package, wherein a second temperature sensing element for detection of the temperature of the optical module package is disposed inside the optical module package in order to control the temperature of the optical module package with the second Peltier element so that precision temperature control and saving of required space can be achieved.

2. Description of the Related Art

With an optical module package incorporating an optical element, control of temperature is generally indispensable to stabilize various characteristics of the optical element. As seen in the case of dual in-line package (DIP), butterfly module package, or the like, stabilization in the temperature of the optical element is normally attempted by incorporating a Peltier element inside the optical module package. However, in case that high precision stability in the temperature thereof is required, stabilization in the temperature of the optical element can be enhanced by the agency of the Peltier element incorporated inside the optical module package in an environment where the temperature of the optical module package in whole has been stabilized by addition of another Peltier element installed at another level.

FIG. 4 is a sectional view showing the schematic construction of a conventional temperature controller of an optical module package, provided with such Peltier elements at two levels. Now the conventional temperature controller of the optical module package is described hereinafter with reference to FIG. 4. Inside an optical module package 1 shown in FIG. 4, a first Peltier element 2 is disposed on and fixed to the bottom surface thereof A base 3 is disposed on the first Peltier element 2, and an optical element 4 as well as a thermistor 5 acting as a first temperature sensing element are disposed on the base 3. The first Peltier element 2 has a function of controlling the temperature of the optical element 4 while the thermistor 5 has a function of controlling the temperature of the first Peltier element 2 by detecting the temperature of the optical element 4.

Further, the optical module package 1 is disposed over a second Peltier element 6 installed on a base platform 9 or the like with a mount 7 interposed therebetween, and a thermistor 8 acting as a second temperature sensing element is fixedly attached to the mount 7.

The second Peltier element 6 has a function of controlling the temperature of the optical module package 1, and the thermistor 8 has a function of controlling the temperature of the second Peltier element 6 by monitoring the temperature of the mount 7. There are cases where the thermistor 8 is embedded in a recess formed in the mount 7.

With the construction of the temperature controller of the optical module package as described above, control of the first Peltier element 2 is effected by monitoring the temperature of the surface of the base 3 with the thermistor 5 disposed inside the optical module package 1. and the temperature of the optical element 4 is controlled by the first Peltier element 2.

Further, to meet requirement for high precision stability in temperature, stability in the temperature of the optical module package 1 is achieved by installing one additional Peltier element at another level, and controlling the additional Peltier element 6 through monitoring the temperature of the surface of the mount 7 with the thermistor 8 so that stability in the temperature of the optical element 4 is attained by the agency of the first Peltier element 2 housed in the optical module package 1 in an environment where the temperature of the optical module package 1 in whole is stabilized.

As shown in FIG. 4, with the conventional temperature controller, stabilization in the temperature of the optical element 4 inside the optical module package 1 has been attempted for by installing Peltier elements at two or more levels. However, with the construction shown in FIG. 4, the thermistor 8 is installed on the mount 7 disposed on the second Peltier element 6, exposing the thermistor 8 and the mount 7 directly to open air. Consequently, the thermistor 8 and the mount 7 are subjected to the effect of open air temperature, creating a cause for erroneous monitoring. This has made it impossible to monitor accurate temperatures, resulting in unstable control of the temperature of the second Peltier element 6 and consequently, that of the optical element 4. Thus a problem of deviation from target temperatures for control has been encountered.

There has been a known countermeasure of shielding the optical module package from open air by covering the external surface thereof with a heat insulating material such as cork or the like, however, in this case, another problem has arisen that an extra space more than necessary is required.

SUMMARY OF THE INVENTION

It is therefore an object of the invention to provide a temperature controller of an optical module package, capable of achieving high precision temperature control and holding down space required to a minimum in carrying out two-stage control of temperature with the use of the Peltier elements.

To this end, the temperature controller of the optical module package according to the invention comprises an optical element fixedly attached to a base housed in an optical module package, a first Peltier element housed in the optical module package, with the base disposed thereon, for controlling the temperature of the optical element, a first thermistor for monitoring the temperature of the surface of the base from within the optical module package to control the first Peltier element, a second Peltier element with the optical module package disposed thereon and fixedly attached thereto for controlling the temperature of the optical module package, and a second thermistor housed in the optical module package for monitoring the temperature of the optical module package to control the second Peltier element.

PREFERRED EMBODIMENTS OF THE INVENTION

Figure 1:
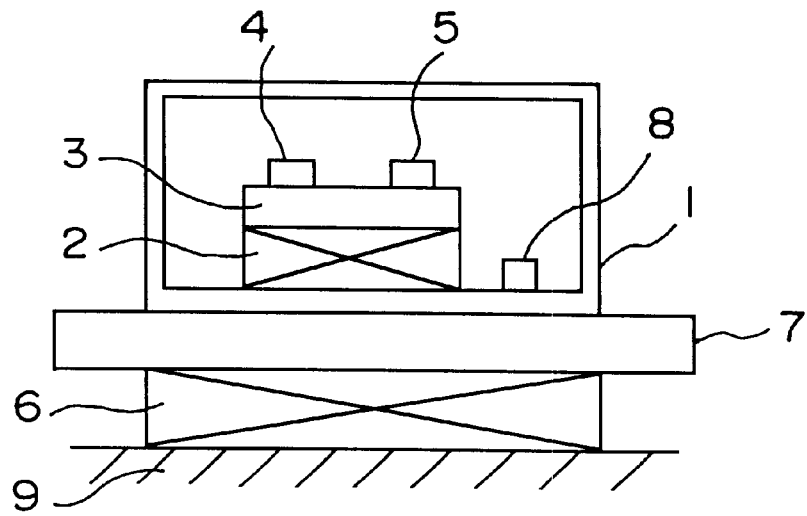
FIG. 1 is a sectional view showing the schematic construction of a temperature controller of an optical module package according to a first embodiment of the invention.
Figure 4:
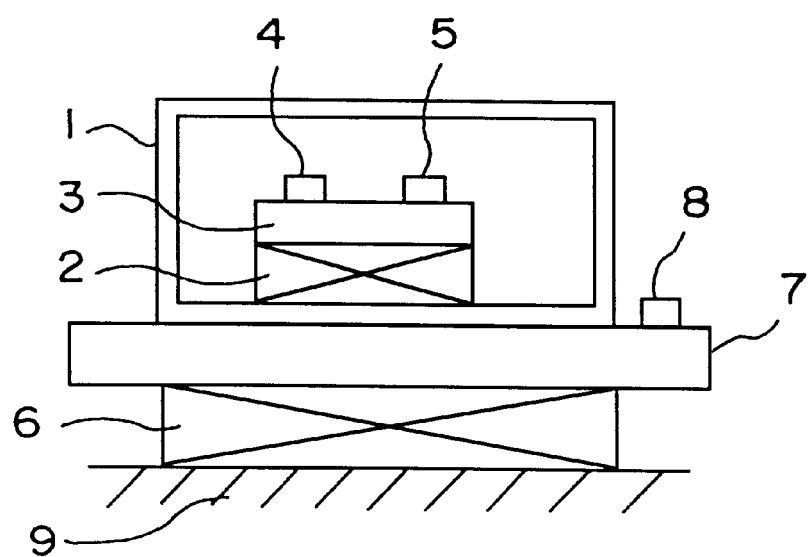
FIG. 4 is a sectional view showing the schematic construction of a conventional temperature controller of an optical module package.

Embodiments of a temperature controller of an optical module package according to the invention are described hereinafter referring to the accompanying drawings. FIG. 1 is a sectional view showing the schematic construction of a first embodiment of the invention. In FIG. 1, parts corresponding to those in FIG. 4 are denoted by the same reference numerals, and explanation will be given mainly on parts differing from those in FIG. 4. In FIG. 1, thermistors 5 and 8 are used as first and second temperature sensing elements, respectively, out of which the thermistor 8 is disposed not on a mount 7, but on the bottom surface of the optical module package in a enclosed state. Otherwise, the construction is the same as that in FIG. 4.

An object of stabilizing the temperature of the optical module package 1 is to stabilize characteristics of an optical element 4 housed in the optical module package 1. Although the optical element 4 is housed in the optical module package 1 and temperature of the optical element 4 is under control by a first Peltier element 2, it is to be pointed out that the optical element 4 is not completely isolated from open air temperature. The temperature of the optical module package 1 is under control by a second Peltier element 6 disposed under the bottom surface of the optical module package 1, however, still under the influence of radiation heat incoming through the upper surface thereof.

Accordingly, in the first embodiment of the invention, the thermistor 8 is housed in the optical module package 1, disposed on the bottom surface thereof, and kept out of contact with open air with the result that the thermistor 8 will not be affected by open air temperature. Consequently, the temperature of the second Peltier element 6, under control by the thermistor 8, can be controlled accurately, and the temperature of the optical module package can be controlled precisely by the second Peltier element 6. Furthermore, since there is no need of installing a member for thermally insulating the thermistor 8, housed in the optical module package 1, from open air temperature, extra space is not required, thus contributing to saving of space.

Figure 2:
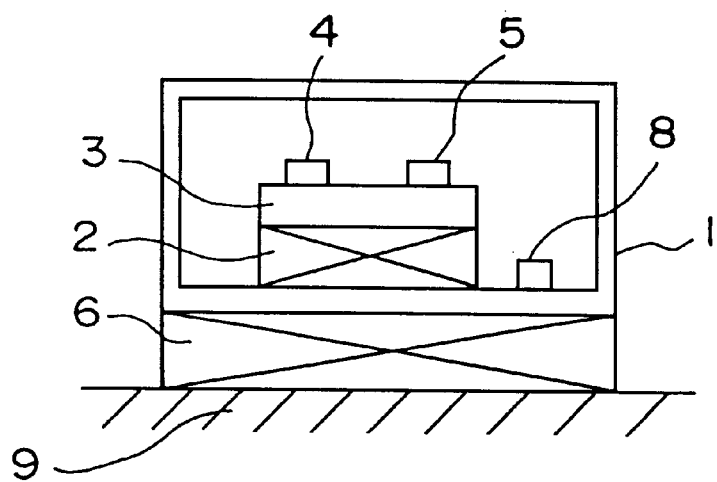
FIG. 2 is a sectional view showing the schematic construction of a temperature controller of an optical module package according to a second embodiment of the invention.

Now, a second embodiment of the invention is described with reference to FIG. 2. FIG. 2 is a sectional view showing the schematic construction of the second embodiment of the invention. In FIG. 2, parts corresponding to those in FIG. 1 are denoted by the same reference numerals, and explanation will be given mainly on parts differing from those in FIG. 1. As is evident from comparison of FIG. 2 with FIG. 1, the mount 7 in FIG. 1 is omitted in FIG. 2 by fixedly attaching the bottom of the optical module package 1 to the upper surface of the Peltier element 6. Otherwise, the construction of the second embodiment of the invention is the same as that of the first embodiment in the FIG. 1.

By omitting the mount 7 as above, the temperature of the optical module package 1 is under direct control by the second Peltier element 6, enabling more precise control thereof. Furthermore, an extra member can be dispensed with as a result of omitting the mount 7, thereby contributing to saving of required space.

Figure 3:
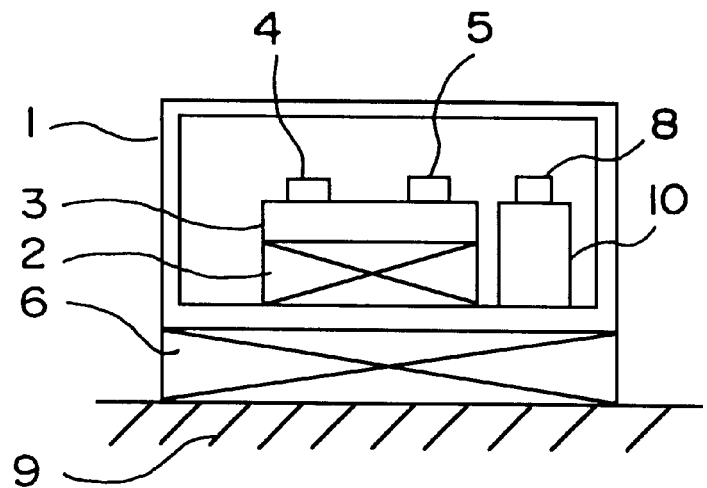
FIG. 3 is a sectional view showing the schematic construction of a temperature controller of an optical module package according to a third embodiment of the invention.

Now, a third embodiment of the invention is described with reference to FIG. 3. FIG. 3 is a sectional view showing the schematic construction of the third embodiment of the invention. In the third embodiment, the mount 7 is omitted as in FIG. 2, and further a metal block 10 is installed inside the optical module package 1 and in the lower part thereof. A thermistor 8 is disposed on the top of the metal block 10 such that the thermistor 8 on the top of the metal block 10 is substantially at the same level as a thermistor 5.

Thus the height of the thermistor 8 is substantially equalized with that of the thermistor 5 inside the optical module package 1 by installing the metal block 10, thereby enabling the temperature of the optical module package 1, at the same level as an optical element 4, to be monitored from within.

Temperature control of the optical module package 1 effected by controlling the second Peltier element 6 on the basis of results of such monitoring as described above enables the temperature of the optical module package 1 at the same level as the thermistor 8 to be stabilized, and consequently, temperature control of the optical element 4 is rendered more accurate with the result that the effect of discrepancy in temperature occurring inside the optical module package 1 due to radiation heat coming therein can be avoided.

With the temperature controller of the optical module package according to the invention, the second temperature sensing element for controlling the temperature of the second Peltier element is housed in the optical module package so that the second temperature sensing element is no longer subjected to the effect of open air temperature. Accordingly, accuracy of the second Peltier element, under control by the second temperature sensing element, in controlling temperature, is enhanced, resulting in enhanced accuracy with which the temperature of the optical module package is controlled by the second Peltier element. Consequently, the temperature of the optical element can be controlled more accurately. Furthermore, omission of the mount has an advantageous effect of space saving. In addition, by disposing the second temperature sensing element substantially at the same level as the first temperature sensing element, the effect of radiation heat on the temperature inside the optical module package can be avoided with the result that accuracy with which the temperature of the optical module package is controlled is enhanced and consequently, control of the temperature of the optical module is rendered more accurate.

What is claimed is:

1. A temperature controller of an optical module package comprising:

an optical element fixedly attached to a base housed in an optical module package;

a first Peltier element housed in the optical module package, with the base disposed thereon, for controlling the temperature of the optical element;

a first temperature sensing element for monitoring the temperature of the surface of the base from within the optical module package to control the first Peltier element;

a second Peltier element with the optical module package disposed thereon and fixedly attached thereto for controlling the temperature of the optical module package; and a second temperature sensing element housed in the optical module package for monitoring the temperature of the optical module package to control the second Peltier element.

2. A temperature controller of an optical module package according to claim 1, wherein the optical module package is fixedly mounted over the second Peltier element with a mount interposed therebetween.

3. A temperature controller of an optical module package according to claim 1, wherein the second temperature sensing element is disposed on and fixedly attached to a metal block inside the optical module package so as to be at a level equivalent to that for the first temperature sensing element.

* * * * *